United States Patent
Carey et al.

(10) Patent No.: US 7,029,821 B2
(45) Date of Patent: Apr. 18, 2006

(54) PHOTORESIST AND ORGANIC ANTIREFLECTIVE COATING COMPOSITIONS

(75) Inventors: Richard J. Carey, Sherborn, MA (US); Peter Trefonas, III, Medway, MA (US); Michael J. Kaufman, Holliston, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 57 days.

(21) Appl. No.: 10/777,997

(22) Filed: Feb. 11, 2004

(65) Prior Publication Data

US 2004/0224254 A1 Nov. 11, 2004

Related U.S. Application Data

(60) Provisional application No. 60/446,916, filed on Feb. 11, 2003.

(51) Int. Cl.
*G03F 7/00* (2006.01)
*G03F 7/004* (2006.01)

(52) U.S. Cl. .................. 430/270.1; 430/326; 430/950
(58) Field of Classification Search ............. 430/270.1, 430/326, 950
See application file for complete search history.

(56) References Cited

U.S. PATENT DOCUMENTS

| | | | |
|---|---|---|---|
| 5,350,714 A | 9/1994 | Trefonas, III et al. | 438/780 |
| 5,492,793 A * | 2/1996 | Breyta et al. | 430/270.1 |
| 5,851,730 A * | 12/1998 | Thackeray et al. | 430/271.1 |
| 5,919,597 A | 7/1999 | Sinta et al. | 430/270.1 |
| 5,994,430 A * | 11/1999 | Ding et al. | 524/80 |
| 6,103,122 A | 8/2000 | Hou et al. | 210/502.1 |
| 6,261,743 B1 | 7/2001 | Pavelchek et al. | 430/325 |
| 6,410,209 B1 * | 6/2002 | Adams et al. | 430/311 |
| 6,773,872 B1 | 10/2002 | Gronbeck et al. | 430/324 |
| 6,586,560 B1 * | 7/2003 | Chen et al. | 528/310 |
| 6,602,652 B1 | 8/2003 | Adams et al. | 430/311 |
| 6,653,049 B1 | 11/2003 | Pavelchek et al. | 430/272.1 |
| 6,767,689 B1 | 7/2004 | Pavelchek et al. | 430/271.1 |
| 6,773,864 B1 | 8/2004 | Thackeray et al. | 430/271.1 |
| 6,790,587 B1 * | 9/2004 | Feiring et al. | 430/270.1 |
| 2002/0187421 A1 | 12/2002 | Hioki et al. | 430/270.1 |
| 2004/0018451 A1 | 1/2004 | Choi | 430/313 |

FOREIGN PATENT DOCUMENTS

WO WO 2004/069959 * 8/2004

* cited by examiner

*Primary Examiner*—Nicole Barreca
(74) *Attorney, Agent, or Firm*—Peter F. Corless; Darryl P. Frickey; Edwards & Angell, LLP

(57) ABSTRACT

Methods are provides methods are provided to prepare photoresist and organic antireflective coating composition with a filter having a mean pore size of less than about 0.4 microns. Photoresist compositions and antireflective coatings produced by such methods can provide manufactured microelectronic devices that have significantly reduced defects. Photoresist and antireflective compositions obtainable by such methods also are provided.

13 Claims, No Drawings

PHOTORESIST AND ORGANIC ANTIREFLECTIVE COATING COMPOSITIONS

This application claims the benefit of U.S. provisional application No. 60/446,916, filed Feb. 11, 2003, which is incorporated herein by reference in its entirety.

BACKGROUND OF THE INVENTION

1. Field of the Invention

The present invention relates to providing improved formulations for use in integrated circuit manufacture, particularly improved photoresist and antireflective coating compositions. Preferred methods of the invention include filtration of such formulations with a small mean pore size (e.g. <0.4 or 0.04 micron) filter, particularly a polyamide filter, prior to use of the composition.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development.

One approach used to reduce the problem of reflected radiation has been the use of an organic radiation absorbing layer interposed between the substrate surface and the photoresist coating layer. See, for example, PCT Application WO 90/03598, EPO Application No. 0 639 941 A1 and U.S. Pat. Nos. 4,910,122; 4,730,405; 4,362,809; and 5,939,236. Such organic underlayers have also been referred to as antireflective layers or antireflective compositions. See also U.S. Pat. Nos. 5,939,236; 5,886,102; 5,851,738; and 5,851,730, all assigned to the Shipley Company, which disclose highly useful antireflective compositions.

While currently available photoresists and antireflective compositions are suitable for many applications, current resists also can exhibit significant shortcomings, particularly in high performance applications such as e.g. formation of highly resolved sub-micron and sub-quarter micron features.

Among other things, particularly problematic are various defects that may occur through lithographic processing, such as pinholes in photoresist coating layers, residual organic matters present after photoresist development, and the like. See, for instance, U.S. Pat. No. 6,605,417. Such organic layer defects can result in defects in the processed microelectronic device.

To improve photoresist performance, certain photoresist filtration procedures have been reported. See U.S. Pat. No. 6,130,122 and U.S. Published Application 20020187421. Such prior filtration approaches have not been wholly satisfactory, particularly for high-performance photoresists used to form extremely small features such as sub-quarter micron lines.

It would be desirable to have new photoresist and antireflective compositions, including photoresist and antireflective compositions that can produce highly resolved images. It also would be desirable to have methods for preparation of such photoresist and antireflective compositions, particularly where the photoresists and antireflective compositions yielded decreased defect levels upon lithographic processing.

SUMMARY OF THE INVENTION

We have now discovered new photoresist compositions and organic antireflective coatings that can provide manufactured microelectronic devices that have reduced defects, including devices that are substantially, essentially or even completely free of defects. We also have discovered new methods to prepare such photoresist and organic antireflective coating compositions.

We have surprisingly found that significantly enhanced performance can result from use of the methods of the invention, including significantly reduced post-etch defect densities of devices manufactured in accordance with the methods disclosed herein. See, for instance, the comparative results of Example 3, which follows.

These results also can provide significant yield improvement and therefore cost reduction in the manufacture of integrated circuits.

More particularly, in a first aspect, methods are provided to prepare a photoresist composition which in general comprise filtering a photoresist composition with a filter having a mean pore size of less than about 0.4 micron. Such filters of even smaller pore size are particularly preferred, such as a mean pore size of about 0.35 microns or less, or about 0.3 microns or less, or even smaller mean pore size such as about 0.25 microns or less or about 0.2 microns or less.

For treatment of photoresist compositions, filters with even smaller pore sizes will provide enhanced results (e.g., reduced defect levels following lithographic processing), such as filters that have mean pore sizes of less than about 0.04 microns, or smaller such as a mean pore size of about 0.035 microns or less, or about 0.03 microns or less, or even smaller mean pore size such as about 0.025 microns or less or about 0.02 microns or less. Such small mean pore sizes are particularly effective with use of a filter having a polyamide filter membrane.

In another aspect, methods are provided to prepare an organic antireflective coating composition which in general comprise filtering an antireflective coating composition with a filter having a mean pore size of less than about 0.4 micron. Such filters of even smaller mean pore size are particularly preferred, such as a mean pore size of about 0.35 microns or less, or about 0.3 microns or less, or even smaller such as a mean pore size of about 0.25 microns or a mean pore size of about 0.2 microns or less.

For treatment of organic antireflective compositions, filters with even smaller pore sizes will provide enhanced results (e.g., reduced defect levels following lithographic processing), such as filters that have mean pore sizes of less than about 0.04 microns, or smaller such as a mean pore size of about 0.035 microns or less, or about 0.03 microns or less, or even smaller mean pore size such as about 0.025 microns or less or about 0.02 microns or less. Such small mean pore sizes are particularly effective with use of a filter having a polyamide filter membrane.

For both treatment of photoresist and antireflective compositions, filters comprising a synthetic filter material (e.g. filter membrane material) are preferred, particularly a polyamide such as a Nylon filter membrane (e.g., Nylon 66). Other suitable filter materials include polypropylene and ultra high density propylene. As discussed above, for filters with polyamide filter membrane (e.g. Nylon 66) particularly small pore sizes have been effective, including mean pore sizes of 0.03 microns or less.

We also have found that the number of cycles of circulation of a volume of a photoresist or antireflective composition through a filter system of the invention can impact defect levels during subsequent lithographic processing. For instance, enhanced results (i.e. reduced levels of defects during subsequent lithographic processing) can be provided where the entire volume of a photoresist or antireflective composition is passed through a preferred filter more than 20 times, more preferably more than 30 or 40 times.

In one suitable filter system of the invention, a tank or other container of a formulated photoresist or antireflective composition is withdrawn through a feed line (e.g. piping) and passed through a small-pore size filter of the invention. Each, successive pass of the entire volume of photoresist or antireflective composition constitutes a single cycle of circulation.

The volume of photoresist or antireflective composition treated through a filter in a single batch accordance with the invention can vary widely, e.g. from 1, 2, 3, 4, 6, 7, or 8 gallons to 10, 20, 30, 40, 50, 60, 70, 80, 90 or 100 gallons or more.

Additionally, while a batch-type treatment of a volume of photoresist or antireflective composition often may be preferred, e.g. for facilitating multiple circulation cycles, a single-pass system also can be beneficial and reduce defects during subsequent use of the resist of antireflective composition. For example, at the completion of preparation, a photoresist or antireflective composition may be passed through a feed line (e.g. piping) that contains one or more small-pore size filters in accordance with the invention and then directly into a storage container such as a brown bottle or larger tank for later bottling and transport to device manufacturer or other user.

A variety of photoresists may be produced in accordance with the invention, including both positive-acting resist compositions and negative-acting resist compositions. Generally preferred are chemically-amplified positive-acting resists, i.e. resists that contain one or more components (e.g. a resin) that comprises photoacid-labile groups such as a photoacid-labile ester (e.g. a polymerized t-butylacrylate or methacrylate unit) or a photoacid-labile acetal group.

Typical photoresists of the invention will contain a photoactive component (e.g. one or more photoacid generators) and a resin component such as a phenolic resin (particularly suitable for 248 nm imaging), a resin that is substantially free of aromatic groups (particularly suitable or sub-200 nm imaging such as 193 nm); and/or a fluorinated resin. Many preferred resins will contain polymerized acrylate groups.

In general use, after the filtration step as discussed above, a coating layer of the photoresist composition is applied on a substrate; the applied photoresist coating layer is exposed to patterned activating radiation; and the exposed photoresist coating layer is developed to provide a resist relief image. A variety of exposure wavelengths can be employed, depending on the sensitivity of the resist components, e.g. sub-300 nm such as 248 nm, or sub-200 nm such as 193 nm or 157 nm.

The filtration step suitably can be performed shortly (e.g. within 1, 2, 6, 12, 24, or 48 hours) prior to application (use) of a photoresist composition, or a photoresist can be filtered and then stored for an extended period (e.g. up to 1, 2, 3, 4, 5, 6, 9 or more months) prior to application (use).

A variety of organic antireflective coating composition may be produced in accordance with the invention. Preferred antireflective coating composition are used with an overcoated photoresist layer, i.e. the antireflective layer is applied as a bottom layer and a photoresist is coated thereover. Preferred antireflective compositions contain one or more components (e.g. a resin) that contain chromophore units that can effectively absorb radiation used to image a pattern into an overcoated photoresist. For instance, anthracene and naphthyl are preferred chromophores for use with an overcoated photoresist that is imaged with 248 nm radiation, and phenyl is a preferred chromophore for use with an overcoated photoresist that is imaged with 193 nm radiation. Particularly preferred are antireflective compositions that contain an acrylate resin that has such chromophore groups.

In general use, the prepared antireflective coating composition (which has been filtered) is applied on a substrate such as a microelectronic wafer; a layer of a photoresist composition is applied over the antireflective composition layer; the photoresist coating layer is exposed to patterned activating radiation; and the exposed photoresist coating layer is developed to provide a resist relief image. Preferably, the photoresist composition also has been filtered in accordance with the invention when used with an antireflective composition of the invention.

As with photoresists, the filtration step in the preparation of an antireflective composition suitably can be performed shortly (e.g. within 1, 2, 6, 12, 24, or 48 hours) prior to application (use) of an antireflective photoresist composition, or an antireflective composition can be filtered and then stored for an extended period (e.g. up to 1, 2, 3, 4, 5, 6, 9 or more months) prior to application (use).

Typically, a photoresist or an antireflective coating composition is prepared to substantial completion before performing filtration, e.g. all components of a liquid photoresist composition or antireflective composition are admixed and then the composition is filtered. However, it is also possible to filter a photoresist composition or antireflective composition and then add one or more components to the filtered composition.

The invention also includes photoresists and antireflective coating compositions obtainable or obtained by a method of the invention. Also provided are substrates coated with an antireflective composition and/or photoresist composition of the invention.

Other aspects of the invention are disclosed infra.

DETAILED DESCRIPTION OF THE INVENTION

As discussed above, we have now discovered new photoresist compositions and organic antireflective coatings that can provide manufactured microelectronic devices that have reduced defects.

Preferred methods of the invention in general comprise filtering a photoresist composition or an organic antireflective composition with a filter having a mean pore size of less than about 0.4 micron. Filters of even smaller pore size are even more preferred, such as filters having a mean pore of about 0.35 microns or less, or about 0.3 microns or less, or even smaller such as about 0.25 microns or less or about 0.2 microns or less.

As discussed above, in many applications, including use of a polyamide (e.g. Nylon) filter membrane, use of filters with even smaller mean pore sizes will provide enhanced results (e.g., reduced defect levels following lithographic processing), such as filters that have mean pore sizes of less than about 0.04 microns, or smaller such as a mean pore size of about 0.035 microns or less, or about 0.03 microns or less, or even smaller mean pore size such as about 0.025 microns or less or about 0.02 microns or less.

As discussed above, we have found that relatively high circulation cycles through a filter of the invention also can further reduce levels of defects upon subsequent lithographic processing.

Preferred filter materials are polyamides, particularly a Nylon filter membrane (e.g. Nylon 66). Polypropylene filter membranes also have provided good results.

Photoresists produced and used in accordance with the invention in general contain a photoactive component and a resin. Suitable photoresists are described for instance in U.S. Pat. No. 6,306,554 to Barclay et al. of the Shipley Company; U.S. Pat. No. 6,042,997 to Barclay et al. of the Shipley Company; WO 02091083 to Gronbeck et al. of the Shipley company; and WO 02077710 to Zampini et al. of the Shipley Company.

Such photoresists may contain a phenolic resin, preferably with photoacid-labile units, which is particularly useful for imaging at 248 nm. Polymers containing polymerized phenolic and photoacid-labile acrylate are particularly preferred for 248 nm imaging. See the above-mentioned U.S. Pat. No. 6,042,997.

For sub-200 nm imaging such as 193 nm, preferably a resist resin will be employed that is substantially free (e.g., less than 5, 4, 3, 2, or 1 mole percent based on total resin) of aromatic groups. See the above-mentioned U.S. Pat. No. 6,306,554.

For imaging at 157 nm imaging, a fluorinated resin may be preferred, such as a resin that has polymerized tetrafluoroethylene units. See the above-mentioned U.S. Patent WO 02077710.

Also preferred are resist resins that contain Si, including for use in so-called bilayer resist systems. See the above-mentioned WO 02091083.

Additional preferred positive-acting photoresists that can be produced in accordance with the invention contain an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference.

3) a resin that contains repeat units that contain a hetero atom, particularly oxygen polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

The resist resin component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 157 nm, 193 nm and 248 nm imaging include imidosulfonates such as compounds of the following formula:

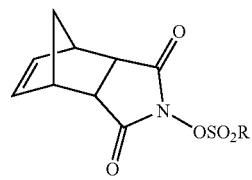

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbomene-2,3-dicarboximide.

Sulfonate compounds are also suitable PAGs, particularly sulfonate salts. Two suitable agents are the following PAGS 1 and 2:

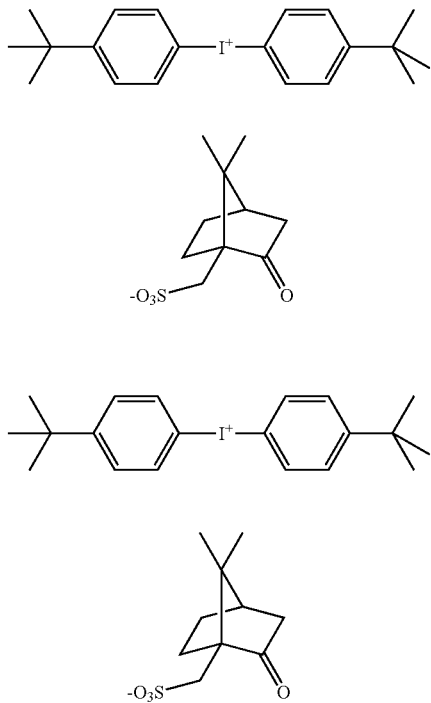

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$-where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

Negative-acting photoresists of the invention typically will contain a crosslinking component, preferably as a separate resist component. Amine-based crosslinkers often will be preferred such as a melamine, e.g. the Cymel melamine resins.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

A filtration step as discussed above is suitably performed after the resist preparation.

Suitable antireflective produced and used in accordance are disclosed e.g. in U.S. Pat. No. 6,503,689 to Zampini et al. of the Shipley Company; U.S. Pat. No. 6,410,209 to Adams et al. of the Shipley company; U.S. Pat. No. 6,190,839 to Pavelchek et al. of the Shipley Company; and U.S. Pat. No. 6,261,743 to Pavelchek et al. of the Shipley Company.

An antireflective coating composition can be readily prepared by admixing the composition components in a suitable solvent. For example, a resin with chromophore units, an acid or thermal acid generator and a crosslinker such as a melamine may be admixed in propylene glycol monomethyl ether or ethyl lactate. See the above-mentioned patents.

A filtration step as discussed above is suitably performed after the antireflective composition preparation.

Photoresists and antireflective coating compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

In use, an antireflective coating composition of the invention is applied as a coating layer to a substrate by any of a variety of methods such as spin coating. The antireflective composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied antireflective coating layer is cured before a photoresist composition is applied over the antireflective composition. Cure conditions will vary with the components of the antireflective composition. Particularly the cure temperature will depend on the specific acid or acid (thermal) generator that is employed in the coating composition. Typical cure conditions are from about 80° C. to 225° C. for about 0.5 to 40 minutes. Cure conditions preferably render the coating composition coating layer substantially insoluble to the photoresist solvent as well as an alkaline aqueous developer solution.

After such curing, a photoresist is applied over the surface of the antireflective coating composition (if the antireflective layer is present). As with application of the bottom coating composition, the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the antireflective coating layer if present.

The following non-limiting examples are illustrative of the invention. All documents mentioned herein are incorporated herein by reference.

EXAMPLE 1

Photoresist preparation

A photoresist is prepared by mixing the following components with amount expressed as weight percents based on total weight of the resist composition:

| Resist components | Amount (wt. % based on total solids) |
|---|---|
| Resin binder | 28.2 |
| Photoacid generator | 0.52 |
| Basic additive | 0.03 |
| Surfactant | 0.03 |

The resin binder is a terpolymer that contains polymerized units of styrene, hydroxystyrene, and t-butylacrylate. The photoacid generator is triphenylsulfonium triflate. The basic additive is triisopropanol amine. The surfactant is Silwet (Dow Chemical). Those resist components were formulated at 16 wt. % solids in a solvent of ethyl lactate.

The thus prepared photoresist is filtered through a 0.02 micron (mean pore size) nylon filter membrane made from Nylon 66.

EXAMPLE 2

Antireflective Coating Composition Preparation

An antireflective coating composition is prepared by mixing the following components with amount expressed as grams:

| Antireflective components | Amount (grams) |
|---|---|
| Resin | 1.2 |
| Crosslinker: | 0.2 |
| Photoacid generator | 0.01 |
| Thermal acid generator | 0.01 |
| Surfactant | 0.03 |
| Solvent | 28.5 |

The resin binder is a copolymer that contains polyermized units of 9-anthrylmethylmethacrylate and 2-hydroxyethylmethacrylate. The photoacid generator is triphenylsulfonium triflate. The basic additive is triisopropanol amine. The surfactant is Silwet (Dow Chemical). The solvent is propylene glycol monomethyl ether.

The thus prepared antireflective composition is filtered through a 0.02 micron (mean pore size) nylon filter membrane made from Nylon 66.

EXAMPLE 3

Comparative Results

Photoresist compositions and organic antireflective coating compositions as generally prepared in Examples 1 and 2 were lithographically processed. It was found that such photoresist compositions and compositions and organic antireflective coating compositions that were filtered through a 0.02 micron (mean pore size) Nylon filter provided reduced post-etch defect density by up to 80% compared to other filtration using high density polyethylene or polytetrafluoroethylene membranes.

The foregoing description of the invention is merely illustrative thereof, and it is understood that variations and modification can be made without departing from the spirit or scope of the invention as set forth in the following claims.

What is claimed is:

1. A method for preparing a photoresist composition, comprising filtering a photoresist composition with a filter having a mean pore size of about 0.03 microns or less, wherein the filter comprises a polymide filter membrane.

2. The method of claim 1 wherein the photoresist is a chemically-amplified positive resist composition.

3. The method of claim 1 wherein the filter has a mean pore size of about 0.025 microns or less.

4. The method of claim 1 wherein the filter has a mean pore size of about 0.02 microns or less.

5. The method of claim 1 wherein the photoresist is passed through the filter more than 20 times.

6. A method for preparing a photoresist composition, comprising filtering a photoresist composition through a filter having a pore size of about 0.03 microns or less, wherein the filter membrane a Nylon material.

7. The method of claim 6 wherein the filter has a pore size of about 0.025 microns or less.

8. The method of claim 6 wherein the filter has a pore size of about 0.02 microns or less.

9. A method for preparing an organic antireflective coating composition for use with an overcoated photoresist composition, comprising filtering an organic coating composition with a filter having a mean pore size of about 0.03 microns or less, wherein the filter membrane comprises a Nylon material.

10. The method of claim 9 wherein the filter has a mean pore size of about 0.02 microns or less.

11. The method of claim 9 wherein the filter has a mean pore size of about 0.025 microns or less.

12. The method of claim 9 wherein the filter has a mean pore size of about 0.02 microns or less.

13. The method of claim 9 wherein the antireflective coating composition is passed through the filter more than 20 times.

* * * * *